United States Patent [19]

Jun

[11] Patent Number: 5,256,591
[45] Date of Patent: Oct. 26, 1993

[54] METHOD FOR FORMING ISOLATION REGION IN SEMICONDUCTOR DEVICE USING TRENCH

[75] Inventor: Young K. Jun, Seoul, Rep. of Korea

[73] Assignee: Gold Star Electron Co., Ltd., Chungcheongbuk, Rep. of Korea

[21] Appl. No.: 898,209

[22] Filed: Jun. 12, 1992

[30] Foreign Application Priority Data

Jun. 17, 1991 [KR] Rep. of Korea ............... 9971/1991
Jun. 18, 1991 [KR] Rep. of Korea ............. 10104/1991

[51] Int. Cl.$^5$ .......................................... H01L 21/76
[52] U.S. Cl. ................................... 437/67; 437/228; 437/245; 437/160
[58] Field of Search ............... 148/DIG. 50, DIG. 85, 148/DIG. 86; 437/67, 228, 245, 160

[56] References Cited

FOREIGN PATENT DOCUMENTS 316165  5/1989  European Pat. Off. .
1-223727  9/1989  Japan .

Primary Examiner—George Fourson
Attorney, Agent, or Firm—Faegre & Benson

[57] ABSTRACT

A method for forming an isolation region in a semiconductor device using a trench comprising the steps of forming a reaction restraining layer on a semiconductor substrate, removing a portion of the reaction restraining layer corresponding to a trench region for providing an isolation region, forming a reaction film on the entire exposed surface, heat treating the reaction film and the substrate, to form a reaction product film having a predetermined depth in a portion of the reaction film and a portion of the substrate corresponding to said trench region, etching and removing the reaction product film, to form a trench, forming an insulation film for the isolation region such that it fills sufficiently the trench, forming a surface smoothing insulation film on the insulation film for the isolation region, etching back both the insulation films such that their portions located above a predetermined height from the surface of the substrate are removed, and removing the remaining reaction restraining layer.

22 Claims, 8 Drawing Sheets

METHOD FOR FORMING ISOLATION REGION IN SEMICONDUCTOR DEVICE USING TRENCH

BACKGROUND OF THE INVENTION

1. Field of the Invention

The present invention relates to a method for forming an isolation region providing an isolation between neighboring elements in making a semiconductor device, and more particularly to a method for forming such an isolation region using a trench.

2. Description of the Prior Art

A method for forming an isolation region using a trench in the manufacture of a complementary metal oxide semiconductor (CMOS) has been known in the technical field and is illustrated in FIGS. 3A to 3G. Such a method will now be described, in conjunction with the drawings.

As shown in FIG. 3A, on a p type silicon substrate 21, a pad oxide film 22 and a nitride film 23 are deposited in this order, using a chemical vapor deposition (CVD) method. Using a photoresist 24 formed on the nitride film 23, a trench region is defined at the nitride film 23.

Using the photoresist 24 as a mask, the nitride film 23 and the oxide film 22 are then subjected to a dry etching, to remove their portions corresponding to the trench region and thus form a trench window, as shown in FIG. 3B. The p type silicon substrate 21 is also subjected to the dry etching using the photoresist 24 as a mask, so as to form a trench at a region located beneath the surface of the p type silicon substrate 21.

Following a removal of the photoresist 24, a polysilicon film 25 is deposited on the entire exposed surface, as shown in FIG. 3C. The polysilicon film 25 is made of polysilicon doped with p type impurity ions such as boron ions and serves as a diffusion source for n type channel stop ions.

Thereafter, a photoresist 26a is formed on a desired portion of the polysilicon film 25, to define an n type well region in the substrate 21. Such an n type well region is needed for providing a p type metal oxide semiconductor (PMOS). Using the photoresist 26a as a mask, the polysilicon 25 is then dry etched to remove its portion corresponding to the defined n type well region. using the photoresist 26a as a mask again, n type impurity ions are slantly implanted in the n type well region. By an annealing process, the implanted impurity ions are diffused to obtain an n type well for the PMOS.

The photoresist 26 is then removed, as shown in FIG. 3E. The polysilicon film 25 remaining in an n type metal oxide semiconductor (NMOS) region is then subjected to an annealing process so that p type boron ions doped in the polysilicon film 25 are diffused, thereby forming a p type channel stop layer 28 at a region located beneath a surface portion of the trench corresponding to the NMOS region, as shown in FIG. 3F.

As shown in FIG. 3F again, the polysilicon film 25 is then removed and an oxide film 29 is thermally formed in the trench. For providing an isolation region, an oxide film 30 is then deposited on the entire exposed surface, using the CVD method. This deposition is carried out such that the trench is completely filled with the oxide film 30. However, a groove is formed on the oxide film 30 above the trench. This groove is filled with a smoothing polymer 31, so as to make the surface of the oxide film 30 smooth.

Subsequently, the oxide film 30 including the polymer 31 is etched backed from its surface to the surface of nitride film 23 using a dry etch process, thereby forming a surface-smoothed element isolating region 30a, as shown in FIG. 3G.

However, the above-mentioned prior art has the following problems.

First, since the p type silicon substrate is vertically etched back using the dry etch process to form the trench therein, it is likely to generate crystal defects in the substrate at bottom and side portions of the trench.

Second, the depth of trench is varied depending on the pattern size in each element isolating region, thereby varying the size of the groove which is formed when the oxide film is deposited to fill the trench. As a result, a step referred to as a micro loading effect occurs between neighboring isolation regions.

SUMMARY OF THE INVENTION

Therefore, an object of the invention is to provide a method for forming an isolation region in a semiconductor device using a trench, capable of avoiding occurrences of crystal defects and a micro loading effect in a formation of the trench for providing the isolation region.

In one aspect, the present invention provides a method for forming an isolation region in a semiconductor device using a trench comprising the steps of: forming a reaction restraining layer on a semiconductor substrate; removing a portion of said reaction restraining layer corresponding to a trench region defined in advance, to form a trench mask window; forming a reaction film on the entire exposed surface; etching said reaction film to form side wall reaction films at opposite side walls of said trench mask window; heat treating said side wall reaction films and said substrate at a predetermined temperature, to form reaction product films at the side wall reaction films and portions of the substrate located beneath the side wall reaction films; removing said reaction product films and then etching a portion of the substrate located in said trench region, to form a trench having a predetemined depth in the substrate; forming an insulation film for an element isolating region on the entire exposed surface such that it fills sufficiently the trench including a recess formed by the removal of the reaction product films; forming a surface smoothing insulation film on said insulation film for the element isolating region; etching back both the insulation films such that their portions located above a predetermined height from the surface of the substrate are removed; and removing the remaining reaction restraining layer.

In another aspect, the present invention also provides a method for forming an isolation region in a semiconductor device using a trench comprising the steps of: forming a reaction restraining layer on a semiconductor substrate; removing a portion of said reaction restraining layer corresponding to a trench region defined in advance, to form a trench mask window; forming a reaction film on the entire exposed surface; heat treating said reaction film and said substrate at a predetermined temperature, to form a reaction product film having a predetermined depth in a portion of the reaction film and a portion of the substrate corresponding to said trench region; removing said reaction product film and the reaction film remaining on the reaction restraining layer, to form a trench; forming an insulation film for an element isolating region on the entire exposed surface such that it sufficiently fills the trench; forming a surface smoothing insulation film on said insulation film for the element isolating region; etching back both the insulation films such that their portions located above a predetermined height from the surface of the substrate are removed; and removing the remaining reaction restraining layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1A to 1F, there is illustrated a method for forming an isolation region in a semiconductor device using a trench, in accordance with a first embodiment of the present invention.

Figure 1A:
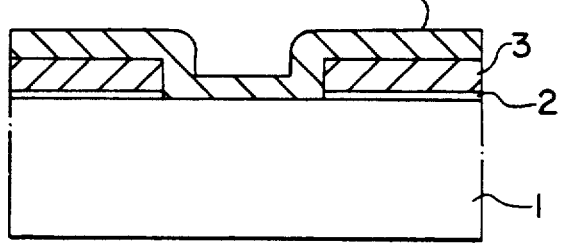
FIGS. 1A to 1F are sectional views of a method for forming an isolation region in a semiconductor device using a trench, in accordance with a first embodiment of the present invention.

In accordance with this embodiment, first, on a silicon substrate 1 there is deposited a pad oxide film 2 and a nitride film 3 in this order thereby forming a reaction restraining layer, using a CVD method, as shown in FIG. 1A. A photolithography process is carried out to define a trench in the substrate 1. As the material of substrate 1, other semiconductor materials may be used.

Thereafter, the nitride film 3 and the pad oxide film 2 are dry etched such that their portions overlying the defined trench region are removed, thereby forming a trench mask window. Over the entire exposed surface, a reaction film 4 is deposited using either a sputtering method or the CVD method.

Figure 1B:
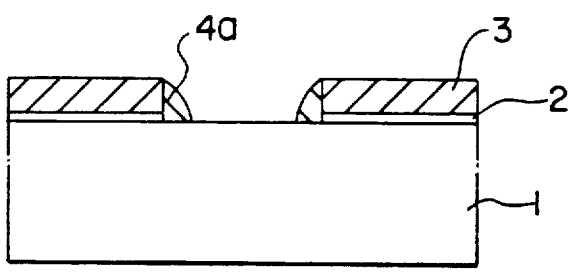
Figure 1C:
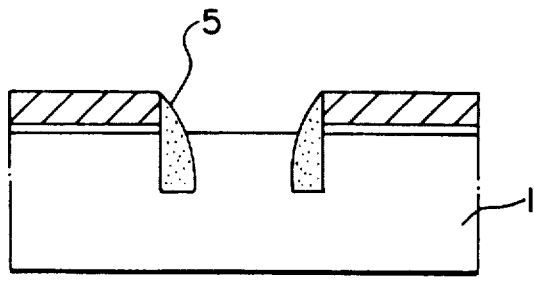

As shown in FIG. 1B, the reaction film 4 is then subjected to an anisotropic dry etch process such as a reactive ion etch process, so as to leave side wall reaction films 4a located at opposite side walls of the trench mask window and remove other portions of the reaction film 4. The material of reaction film 4 may include a metal being reactable with the material of silicon substrate 1 to produce a compound or a metal having a certain solubility making it melt at a certain temperature and penetrate at an atomic state into the silicon substrate 1.

The reaction film 4 is then heat treated at a predetermined temperature in an active or inert atmosphere. At this time, where the reaction film 4 is a metal being reactable with the material of silicon substrate 1, it produces a compound in the reaction product films 5 and to a predetermined depth in portions of the silicon substrate 1 located beneath opposite side wall reaction films 4a. However, where the reaction film 4 is a metal having a predetermined solubility making it melt at a certain temperature and penetrate at an atomic state into the silicon substrate 1, a proper amount (atom 4) thereof is the atomic state penetrates or is impregnated into the lattices of portions of the silicon substrate 1 located beneath opposite side wall reaction films 4a, to a proper thickness or depth determined by the heat treatment temperature. In the latter case, accordingly, the reaction product film 5 is not a compound produced by a reaction between the silicon substrate 1 and the reaction film 4, but is the material of reaction film 4 itself. Thus, the reaction film 4 is either soluble in the substrate or is capable of reacting with the substrate 1 not with the reaction restraining film (that is, the pad oxide film 2 and the nitride film 3), and the reaction restraining film is not capable of reacting with the substrate 1 under the processing conditions employed.

Figure 1D:
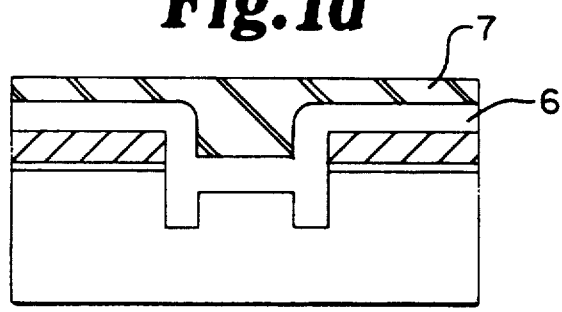

Thereafter, the reaction product films 5 which were formed to have a proper thickness or depth penetration in respective portions of silicon substrate 1 corresponding to opposite edges of the trench region are then removed using a wet etch process, as shown in FIG. 1D. The silicon substrate 1 is then subjected to a dry etch process, so as to form a shallow trench in the trench region. The shallow trench has a depth less than that of the reaction product film 5 into substrate 1.

Various metals usable as the material of reaction film 4 and various compounds (namely, various materials of reaction product film 5) produced by reactions of the metals with the silicon of substrate 1 are shown in TABLE 1.

TABLE 1

| Reaction Film (4) | Reaction Product Film (5) |
|---|---|
| Na | $NaSi_2$ |
| Mg | $Mg_2Si$ |
| Ca | $CaSi_2$, CaSi, $Ca_2Si$ |
| Ba | BaSi |
| La | $LaSi_2$ |
| Ce | $CeSi_2$ |
| Pr | $PrSi_2$ |
| Nd | $NdSi_2$ |
| Sm | $SmSi_2$ |
| Y | YSi |
| Ti | TiSi, $SiSi_2$, $Ti_5Si_3$ |
| Sr | $Sr_2Si_3$ |
| Zr | $ZrSi_2$ |
| Hf | $HfSi_2$ |
| Th | $ThSi_2$ |
| U | USi, $USi_2$, $U_3Si_2$, $U_3Si$ |
| Np | $NpSi_2$ |
| Pu | $PuSi_2$ |
| V | $V_2Si_3$, $VSi_2$, $V_3Si$ |
| Nb | $NbSi_2$, $Nb_5Si_3$ |
| Ta | $TaSi_2$ |
| Cr | $Cr_3Si_2$, $Cr_3Si$, $CrSi_2$, CrSi |
| Mo | $MoSi_2$, $Mo_3Si$, $Mo_5Si_3$ |
| W | $WSi_2$ |
| Mn | $MnSi_2$, MnSi, $Mn_5Si_3$, $Mn_3Si$ |
| Re | $ReSi_2$ |
| Fe | FeSi, $Fe_5Si_3$, $Fe_3Si$ |
| Co | CoSi, $Co_2Si$ |
| Ni | $NiSi_2$, NiSi, $Ni_2Si_2$, $Ni_2Si$, $Ni_5Si_2$, $Ni_3Si$ |
| Ru | RuSi, $Ru_2Si$, $Ru_2Si_3$ |
| Rh | RhSi, $RhSi_{0.5}$, $Rh_2Si$, $Rh_5Si_3$, $Rh_3Si_2$, $RhSi_2$ |
| Pd | PdSi, $Pd_2Si$ |
| Os | $Os_2Si_3$, OsSi |
| Ir | $Ir_3Si_2$, $IrSi_{0.3}$, $IrSi_3$, $Ir_3Si$, $Ir_2Si$ |
| Pt | PtSi, $Pt_2Si$ |
| Be—Zr Alloy | BeZrSi |
| Cu—Mg Alloy | $Cu_{1.6}Mg_6Si_7$, $Cu_3SiMg_2$ |
| Al—Na Alloy | $AlNaSi_4$ |
| Al—Ni Alloy | $AlNi_2Si$ |
| Al—Fe—Mg Alloy | $Al_8FeMg_3Si$ |
| Al—Cu—Mg Alloy | $Al_5Cu_2Mg_8Si$ |
| Pd—Al Alloy | $Pd_4Al_3Si$ |
| Cu | $Cu_3Si$, $Cu_{1.5}Si_4$, $Cu_5Si$, $Cu_7Si$ |
| Al—Cr Alloy | $Al_3CrSi$, $Al_{13}Cr_4Si_4$ |
| Al—Mn Alloy | $Al_5(Mn, Si)_2$, $Al_{21}Mn_3Si_5$, $Al_9Mn_3Si$ |
| Al—Fe Alloy | AlFeSi, $Al_{21}Fe_3Si_5$, $Al_9Fe_2Si_2$, $Al_4FeSi_2$ |

Various metals each having a solubility which is usable as the material of reaction film 4, their heat treatment temperatures and their amounts (atom %) at the atomic state which may penetrate into the silicon substrate 1 in heat treatments are shown in TABLE 2.

TABLE 2

| Reaction Film (4) | Heat Treatment Temperature | Penetrated Atom % |
|---|---|---|
| Al | 557° C.–400° C. | below 4 at % |
| Ba | 1,000° C.–800° C. | below 2 at % |
| Cr | below 1,000° C. | below 6 at % |
| Cu | below 555° C. | below 10 at % |
| Fe | below 540° C. | below 7 at % |
| Ni | below 700° C. | below 10 at % |
| Pb | below 327° C. | 100 at % |
| Sb | below 630° C. | 100 at % |
| Sn | below 232° C. | 100 at % |
| Ti | below 302° C. | 100 at % |

Thereafter, an oxide film 6 an insulation film for an isolation region is deposited over the entire exposed surface using the CVD method, so as to fill completely the trench formed in the silicon substrate 1, as shown in FIG. 1D. At this time, a recess is formed at the upper portion of trench.

In order to fill the recess, a surface smoothing oxide film 7 as an insulation film is deposited on the oxide film 6 using the CVD method. This oxide film 7 has an etch selectivity identical to that of the oxide film 6, but different from that of the nitride film 3.

Figure 1E:
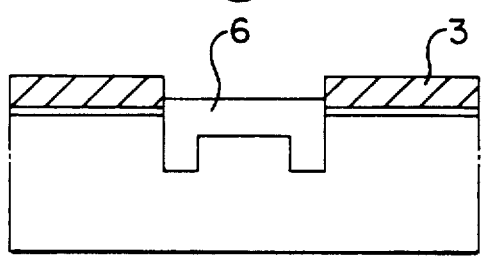

Using the dry etch process, the oxide film 7 is then etched back from its surface to the bottom surface of the recess, as shown in FIG. 1E. At this time, the oxide film 6 located above the bottom surface of the recess together with the oxide film 7 is also etched back. However, the nitride film 3 is not etched back, because of having an etch selectivity different from that of the oxide film 7. Subsequently, a heat treatment of the product is performed at an oxidizing atmosphere to compensate possible defects liable to occur in the silicon substrate during a formation of the shallow trench.

Figure 1F:
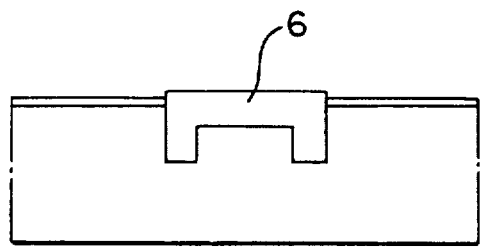

Finally, the nitride film 3 is removed using the wet etch process, as shown in FIG. 1F. Thus, an element isolating region is obtained.

FIGS. 2A to 2H illustrate a method for forming an isolation region in a semiconductor device using a trench in accordance with a second embodiment of the present invention.

Figure 2A:
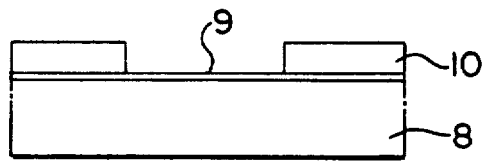
FIGS. 2A to 2H are sectional views of a method for forming an isolation region in a semiconductor device using trench, in accordance with a second embodiment of the present invention.

In this embodiment, first, a pad oxide film 9 and a nitride film 10 are deposited in this order on a silicon substrate 8 using the CVD method or the sputtering method, as reaction restraining layers, as shown in FIG. 2A. A photolithography process is performed to define a trench region on the nitride film 10. At the defined trench region, the nitride film 10 and the pad oxide film 9 are subjected to a dry etch process such that their portions presented in the defined trench region are removed, thereby forming a trench mask window.

Figure 2B:
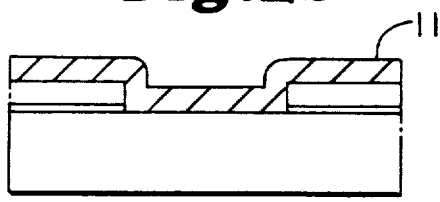
Figure 2C:
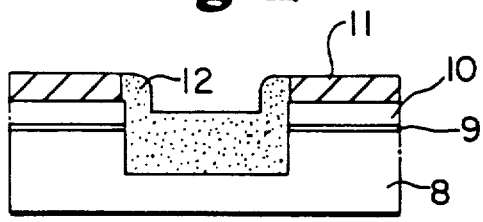

Over the entire exposed surface, a reaction film 11 is then deposited to have a predetermined thickness using the sputtering method or the CVD method and then subjected to a heat treatment at a predetermined temperature, as shown in FIG. 2B. At this time, where the material of reaction film 11 is a metal being reactable with the material of silicon substrate 8 to produce a new compound, a portion of the reaction film 11 and a predetermined thickness portion of the silicon substrate 8 located in the trench region are changed into the compound which forms a reaction product film 12. However, a portion of the reaction film 11 located above the nitride film 10 does not change. On the other hand, where the material of reaction film 11 is a metal having a certain solubility, it melts upon being heat treated at a predetermined temperature and thus a proper amount (at %) thereof at the atomic state penetrates or is impregnated into a predetermined thickness portion of the silicon substrate 8. In the latter case, accordingly, the reaction product film 12 is the material of reaction film 11 itself.

Kinds of metals usable as the material of reaction film 11 and kinds of various materials of reaction product film 12 produced by reactions of the metals with the silicon of substrate 8 are the same as those shown in TABLE 1 and thus a detailed description thereof is omitted. Also, kinds of various metals each having a solubility to be usable as the material of reaction film 11, their heat treatment temperatures and their amounts (at %) at the atomic state penetrated into the silicon substrate 8 in heat treatments are the same as those shown in TABLE 2 and thus a detailed description thereof is omitted.

Figure 2D:
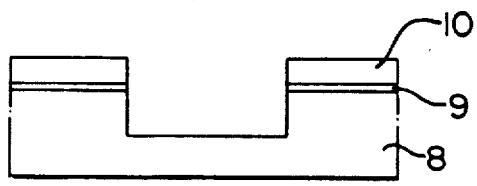
Figure 2E:
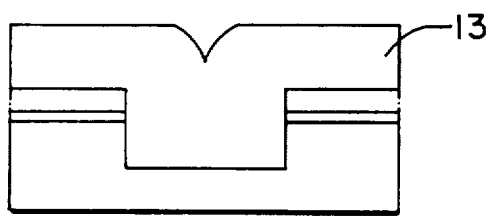

Thereafter, the reaction film 11 and the reaction product film 12 are completely removed using the wet etch process, thereby causing a trench to be formed in the silicon substrate 8, as shown in FIG. 2D. As has been explained above with reference to the first embodiment of the present invention, the reaction film 11 is either soluble in the substrate or is capable of reacting with the substrate 8 but not with the reaction restraining film (that is, the pad oxide film 9 and the nitride film 10), and the reaction restraining film is not capable of reacting with the substrate 8 under the processing conditions employed. An oxide film 13 as an insulation film for an isolation region is deposited over the entire exposed surface using the CVD method. The deposition of oxide film 13 is achieved such that the oxide film 13 covers completely not only the trench, but also the remaining nitride film 10, as shown in FIG. 2E.

Figure 2F:
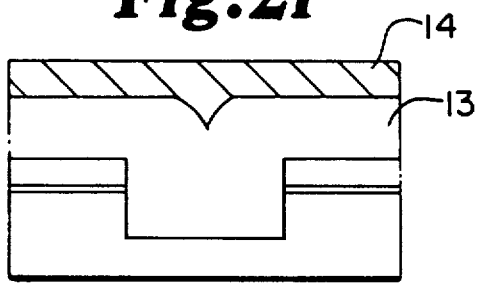

After the deposition of oxide film 13, a groove is generated on the upper portion of the trench region. At this state, the silicon substrate 8 is subjected to a heat treatment at a predetermined temperature, so as to compensate possible defects in the silicon substrate 8 during a formation of the trench. In order to fill the groove sufficiently, a surface smoothing oxide film 14 as an insulation film is then deposited on the oxide film 13 using the CVD method or the sputtering method, as shown in FIG. 2F. This oxide film 14 has an etch selectivity identical to that of the oxide film 13, but different from that of the nitride film 10.

Figure 2G:
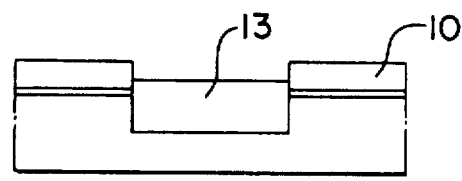

Using the dry etch process, the oxide film 14 and the oxide film 13 are then etched back from the surface of oxide film 14 to the surface of silicon substrate 8, as shown in FIG. 2G. At this time, the nitride film 10 is not etched back, because of having an etch selectivity different from those of oxide films 13 and 14.

Figure 2H:
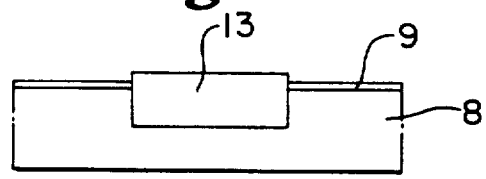
Figure 3A:
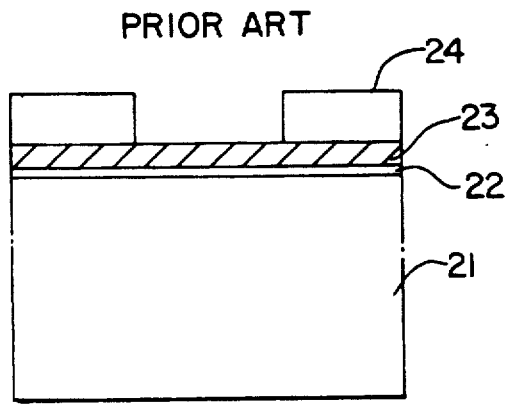
FIGS. 3A to 3G are sectional views of a conventional method for forming an isolation region in a semiconductor device using trench.
Figure 3B:
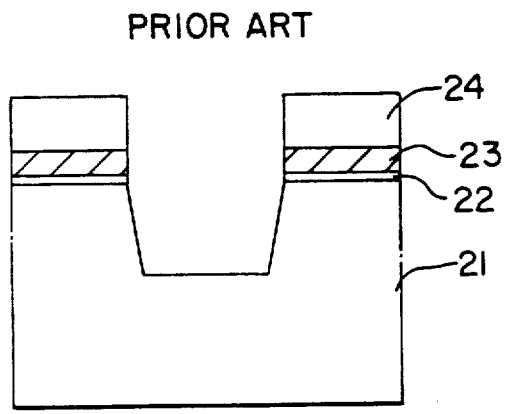
Figure 3C:
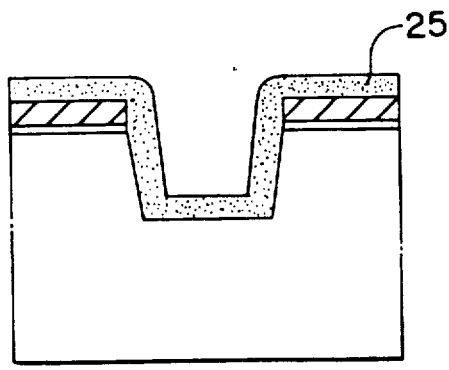
Figure 3D:
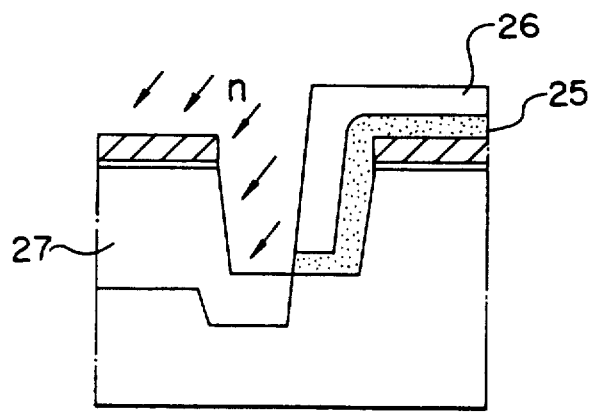
Figure 3E:
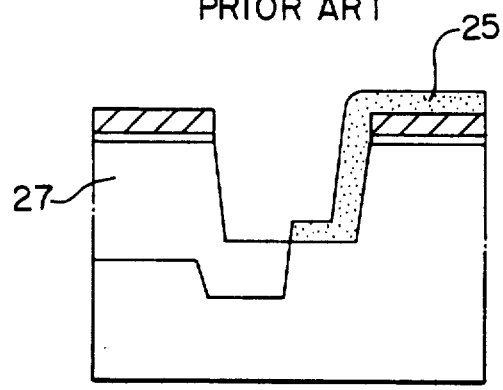
Figure 3F:
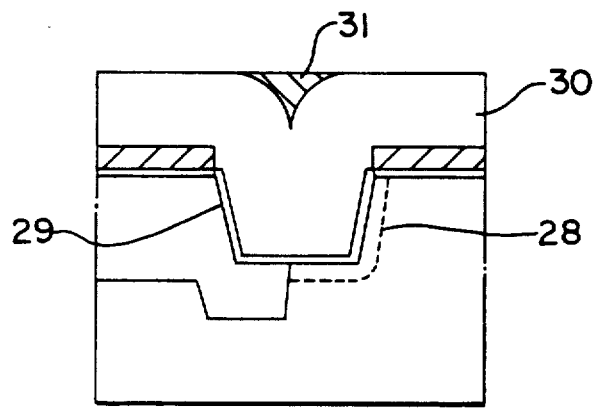
Figure 3G:
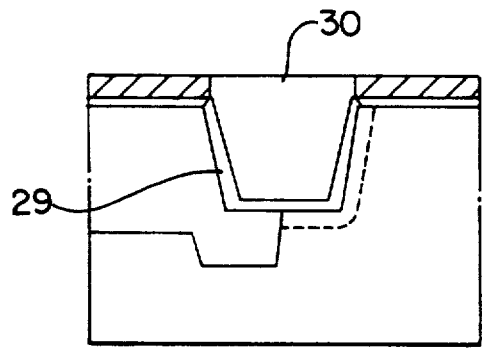

Finally, the remaining nitride film 10 is removed using the dry etch process, as shown in FIG. 2H. Thus, an element isolating region is obtained.

As apparent from the above description, the present invention provides the following effects.

First, in case of the first embodiment, reaction product films are formed around a trench corresponding to an isolation region in a silicon substrate such that they have a depth deeper than that of the trench. These reaction product films are subsequently removed using a wet etch process. Accordingly it possible to avoid the silicon substrate from being damaged at side wall portions and bottom portions of the trench. Also, the reaction product films make it possible for the trench to have a uniform depth irrespective of the pattern size of the element isolating region. By filling the trench with an insulation film for the isolation region, there is no formation of a groove above the trench region. As a result, it is possible to avoid an occurrence of a micro loading effect.

Second, in case of the second embodiment, a similar reaction product film is formed in a trench region defined in the same manner as that of the first embodiment and subsequently removed using a wet etch process to form a trench for an isolation region. Accordingly, there is no problem that the substrate is damaged at side wall portions and bottom portions of the trench, upon forming the trench using a dry etch process as in the prior art.

Although the preferred embodiments of the invention have been disclosed for illustrative purpose, those skilled in the art will appreciated that various modifications, additions and substitutions are possible, without departing from the scope and spirit of the invention as disclosed in the accompanying claims.

What is claimed is:

1. A method for forming an isolation region in a semiconductor device using a trench comprising the steps of:
    forming a reaction restraining layer on a semiconductor substrate;
    removing a portion of said reaction restraining layer in a trench region to form a trench mask window;
    forming a reaction film on the entire exposed surface;
    etching said reaction film to form side wall reaction films at opposite side walls of said trench mask window;
    heat treating said side wall reaction films and said substrate at a sufficient to form reaction product films at the side wall reaction films and portions of the substrate located beneath the side wall reaction films;
    removing said reaction product films and then etching a portion of the substrate located in said trench region, to form a trench halving a depth in the substrate less than a depth of the reaction product film into the substrate;
    forming an insulation film for an element isolating region on the entire exposed surface such that it fills the trench including a recess formed by the removal of the reaction product films;
    forming a surface smoothing insulation film on said insulation film for the element isolating region;
    etching back both the insulation films such that portions located above a set height from the surface of the substrate are removed; and
    removing the remaining reaction restraining layer.

2. A method in accordance with claim 1, wherein said reaction restraining layer comprises a pad insulation film formed on said semiconductor substrate, and a reaction restraining film formed on said pad insulation film.

3. A method in accordance with claim 1, wherein a material of said reaction film is a first metal having a solubility sufficient to allow said first metal to penetrate into lattice portions of the substrate located beneath the side wall reaction films to a thickness and depth determined by the heat treatment temperature or a second metal reactable with a semiconductor material of said substrate to change into a compound.

4. A method in accordance with claim 3, wherein said first metal is selected from a group consisting of Al, Ba, Cr, Fe, Ni, Pb, Sb, Sn and Ti.

5. A method in accordance with claim 3, wherein said second metal is selected from a group consisting of Na, Mg, Ca, Ba, La, Ce, Pr, Nd, Sm, Y, Ti, Sr, Zr, Hf, Th, U, Np, Pu, V, Nb, Ta, Cr, Mo, W, Mn, Re, Fe, Co, Ni, Ru, Rh, Pd, Os, Ir, Pt, Be-Zr alloy, Cu-Mg alloy, Al-Na alloy, Al-Cr alloy, Al-Mn alloy, Al-Fe alloy, Al-Ni alloy, Al-Fe-Mg alloy, Al-Cu-Mg alloy, Pd-Al alloy, and Cu.

6. A method in accordance with claim 1, wherein said step of etching said reaction film to form side wall reaction films comprises an anisotropic dry etch process.

7. A method in accordance with claim 6, wherein said anisotropic dry etch process is a reactive ion etch process.

8. A method in accordance with claim 1, wherein said surface smoothing insulation film and said insulation film for the isolation region have etch selectivities identical to each other and different from that of said reaction restraining layer.

9. A method in accordance with claim 1, further comprising a step of heat treating said substrate after the removal of said reaction product films and the formation 10. A method in accordance with claim 1, wherein said semiconductor material is made of silicon.

11. A method in accordance with claim 1, wherein said etching for removing said reaction product films is a wet etching and said etching for forming said trench is a dry etching.

12. A method in accordance with claim 1, wherein said step of forming said insulation film for the element isolating region comprises a deposition process using a sputtering method or a chemical vapor deposition method.

13. A method for forming an isolation region in a semiconductor device using a trench comprising the steps of:
    forming a reaction restraining layer on a semiconductor substrate;
    removing a portion of said reaction restraining layer in a trench region to form a trench mask window;
    forming a reaction film on the entire exposed surface;
    heat treating said reaction film and said substrate at a temperature sufficient to form a reaction product film having a depth in a portion of the reaction film and a portion of the substrate corresponding to said trench region;
    removing said reaction product film and the reaction film remaining on the reaction restraining layer, to form a trench;
    forming an insulation film for an element isolating region on the entire exposed surface such that it fills the trench;
    forming a surface smoothing insulation film on said insulation film for the element isolating region;
    etching back both the insulation films such that portions located above a set height from the surface of the substrate are removed; and
    removing the remaining reaction restraining layer.

14. A method in accordance with claim 13, wherein said reaction restraining layer comprises a pad insulation film formed on said semiconductor substrate, and a reaction restraining film formed on said pad insulation film.

15. A method in accordance with claim 13, wherein a material of said reaction film is a first metal having a solubility sufficient to allow said first metal to penetrate into lattice portions of the substrate located beneath the reaction film to a thickness and depth determined by the heat treatment temperature or a second metal reactable with a semiconductor material of said substrate to change into a compound.

16. A method in accordance with claim 15, wherein said first metal is selected from a group consisting of Al, Ba, Cr, Cu, Fe, Ni, Pb, Sb, Sn and Ti.

17. A method in accordance with claim 15, wherein said second metal is selected from a group consisting of Na, Mg, Ca, Ba, La, Ce, Pr, Nd, Sm, Y, Ti, Sr, Zr, Hf, Th, U, Np, Pu, V, Nb, Ta, Cr, Mo, W, Mn, Re, Fe, Co, Ni, Ru, Rh, Pd, Os, Ir, Pt, Be-Zr alloy, Cu-Mg alloy, Al-Na alloy, Al-Cr alloy, Al-Mn alloy, Al-Fe alloy, Al-Ni alloy, Al-Fe-Mg alloy, Al-Cu-Mg alloy, Pd-Al alloy, and Cu.

18. A method in accordance with claim 13, wherein said surface smoothing insulation film and said insulation film for the isolation region have etch selectivities identical to each other and different from that of said reaction restraining layer.

19. A method in accordance with claim 13, further comprising a step of heat treating said substrate after the formation of said trench by the removal of said reaction product film, to compensate defects in the substrate.

20. A method in accordance with claim 13, wherein said semiconductor material is made of silicon.

21. A method in accordance with claim 13, wherein said step of removing said reaction product film to form said trench comprises a wet etching.

22. A method in accordance with claim 13, wherein said step of forming said insulation film for the element isolating region comprises a deposition process using a sputtering method or a chemical vapor deposition method.

* * * * *

UNITED STATES PATENT AND TRADEMARK OFFICE
CERTIFICATE OF CORRECTION

PATENT NO. : 5,256,591
DATED : October 26, 1993
INVENTOR(S) : Young K. JUN It is certified that error appears in the above-identified patent and that said Letters Patent is hereby corrected as shown below:

column 7, line 39, after "a", the word --temperature-- should be inserted;

column 7, line 45, "halving" should be corrected to read --having--;

column 8, line 28, after "tion", the following phrase should be added --of said trench, to compensate defects in the substrate.--

Signed and Sealed this

Sixteenth Day of May, 1995

Attest:

BRUCE LEHMAN

*Attesting Officer*   *Commissioner of Patents and Trademarks*